(12) United States Patent
Yun et al.

(10) Patent No.: US 7,969,800 B2
(45) Date of Patent: Jun. 28, 2011

(54) SEMICONDUCTOR MEMORY APPARATUS

(75) Inventors: Tae Sik Yun, Ichon-si (KR); Kang Seol Lee, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 52 days.

(21) Appl. No.: 12/493,734

(22) Filed: Jun. 29, 2009

(65) Prior Publication Data
US 2010/0232239 A1    Sep. 16, 2010

(30) Foreign Application Priority Data
Mar. 12, 2009    (KR) .................. 10-2009-0021162

(51) Int. Cl.
*G11C 7/00* (2006.01)
(52) U.S. Cl. ........................ 365/191; 365/194
(58) Field of Classification Search .................... 365/191
See application file for complete search history.

(56) References Cited

U.S. PATENT DOCUMENTS

| | | | |
|---|---|---|---|
| 5,623,446 A * | 4/1997 | Hisada et al. | 365/189.11 |
| 6,765,842 B2 | 7/2004 | Kim | |
| 7,248,517 B2 * | 7/2007 | Lee et al. | 365/203 |
| 7,289,385 B2 * | 10/2007 | Kwak | 365/230.03 |
| 7,339,847 B2 | 3/2008 | Kim et al. | |
| 7,499,367 B2 * | 3/2009 | Park | 365/230.06 |
| 7,539,070 B2 * | 5/2009 | Ko | 365/191 |
| 7,668,026 B2 * | 2/2010 | Kyung et al. | 365/194 |
| 2006/0028888 A1 * | 2/2006 | Shin et al. | 365/205 |
| 2009/0168588 A1 * | 7/2009 | Shim | 365/230.03 |

* cited by examiner

Primary Examiner — Son L Mai
(74) Attorney, Agent, or Firm — Ladas & Parry LLP

(57) ABSTRACT

A semiconductor memory apparatus includes a row path activating unit configured to generate a line connection control signal according to a received address and active command. The semiconductor memory apparatus also includes a cell array circuit unit including an input/output line switch for connecting a first input/output line in a cell block and a second input/output line extending to the outside of the cell block. The cell array also including a bit line switch for connecting a bit line pair to each other. The input/output line switch and the bit line switch are further controlled by the line connection control signal from the row path activating unit.

13 Claims, 6 Drawing Sheets

SEMICONDUCTOR MEMORY APPARATUS

CROSS-REFERENCES TO RELATED PATENT APPLICATION

The present application claims priority under 35 U.S.C 119(a) to Korean Application No. 10-2009-0021162, filed on Mar. 12, 2009, in the Korean Intellectual Property Office, which is incorporated herein by reference in its entirety as set forth in full.

BACKGROUND

1. Technical Field

The present invention herein relates generally to a semiconductor apparatus, and more particularly, to a semiconductor memory apparatus.

2. Related Art

An operating current has a large influence on the performance of a semiconductor memory apparatus. Therefore, various ways to reduce the operating current are considered.

It is very important to decrease a current used in a cell array circuit unit in order to reduce the operating current of the semiconductor memory apparatus.

Further, as the degree of integration for the semiconductor memory apparatus increases, signal line layout of the semiconductor memory apparatus for controlling the cell array circuit unit and the securing of a layout margin become increasingly important.

Accordingly, development of a semiconductor memory apparatus that can reduce current consumption and decrease the number of signal lines related to the cell array circuit unit is needed.

SUMMARY

A semiconductor apparatus, and more particularly, a semiconductor memory apparatus, that can reduce current consumption of a cell array circuit unit is disclosed herein.

A semiconductor memory apparatus according to an embodiment of the present invention can decrease the number of signal lines for controlling connection or disconnection between an IO (Input/Output) line and a bit line is also disclosed herein.

In one embodiment of the present invention, a semiconductor memory apparatus includes a row path activating unit configured to generate a line connection control signal according to an address and an active command; and a cell array circuit unit including an input/output line switch for connecting a first input/output line in a cell block and a second input/output line extending to the outside of the cell block to each other and a bit line switch for connecting a bit line pair to each other, and configured to control the input/output line switch and the bit line switch using the line connection control signal.

In another embodiment of the present invention, a semiconductor memory apparatus includes a row path activating unit configured to activate a line connection control signal when an active command and an address corresponding to the row path activating unit are inputted; and a cell array circuit unit including a cell block, an input/output line switch, and a bit line switch, wherein the cell array circuit unit connects a first input/output line in the cell array circuit unit and a second input/output line extending outside of the cell array circuit unit to each other by controlling the input/output line switch according to the activated line connection control signal and disconnects a bit line pair by controlling the bit line switch.

In yet another embodiment of the present invention, a semiconductor memory apparatus includes a signal generation circuit block configured to generate a line connection control signal according to an active command and an address; a cell block including memory cells and a bit line sense amplifier connected to the memory cell through a bit line pair; an input/output line switch configured to connect or disconnect a first input/output line connected to the bit line sense amplifier and a second input/output line extending outside of the cell block to or from each other according to the line connection control signal; and a bit line switch configured to disconnect or connect the bit line pair from or to each other according to the line connection control signal IO These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
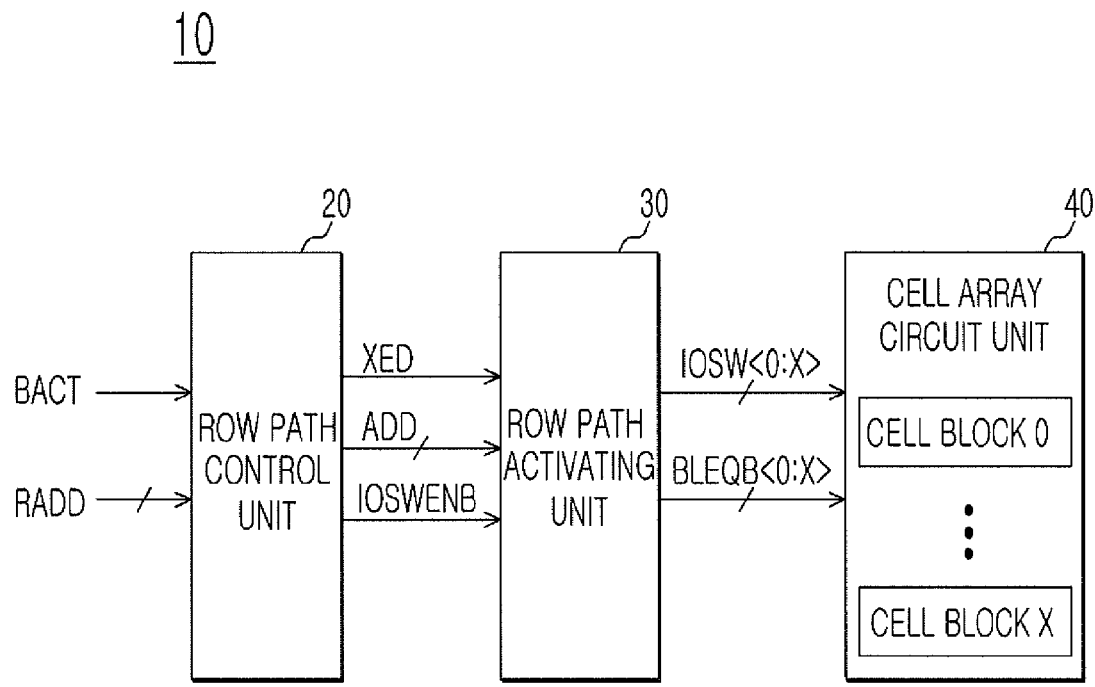
FIG. 1 is a block diagram showing an embodiment of a semiconductor memory apparatus.

FIG. 1 is a block diagram showing an embodiment of a semiconductor memory apparatus.

FIG. 1 illustrates a circuit region that is also referred to as a 'X-Hole', i.e., a circuit region for connecting data of a cell array circuit unit to a peripheral circuit region.

As shown in FIG. 1, the semiconductor memory apparatus 10 can include a row path control unit 20, a row path activating unit 30, and a cell array circuit unit 40.

The row path control unit 20 can generate a word line enable signal 'XED', a decoding address 'ADD', and an input/output line switch enable bar signal 'IOSWENB' according to a received bank active command 'BACT' and a received row address 'RADD'.

The row path activating unit 30 can generate IO switching signals 'IOSW<0:X>' and bit line equalize bar signals 'BLEQB<0:X>' using the word line enable signal 'XED', the decoding address 'ADD', and the input/output line switch enable bar signal 'IOSWENB' from the row path control unit 20.

The cell array circuit unit 40 can include a plurality of cell blocks (CELL BLOCK 0 to CELL BLOCK X).

When the bank active command 'BACT' is inputted to the row path control unit 20, the row path control unit 20 can generate the word line enable signal 'XED' having a predetermined timing margin in comparison with the bank active command 'BACT'.

The row path control unit 20 can output the decoding address 'ADD' by decoding the row address 'RADD'.

The row path control unit 20 can generate the input/output line switch enable bar signal 'IOSWENB' by mixing a signal for designating deactivation timing of a word line and the word line enable signal 'XED'.

Figure 2:
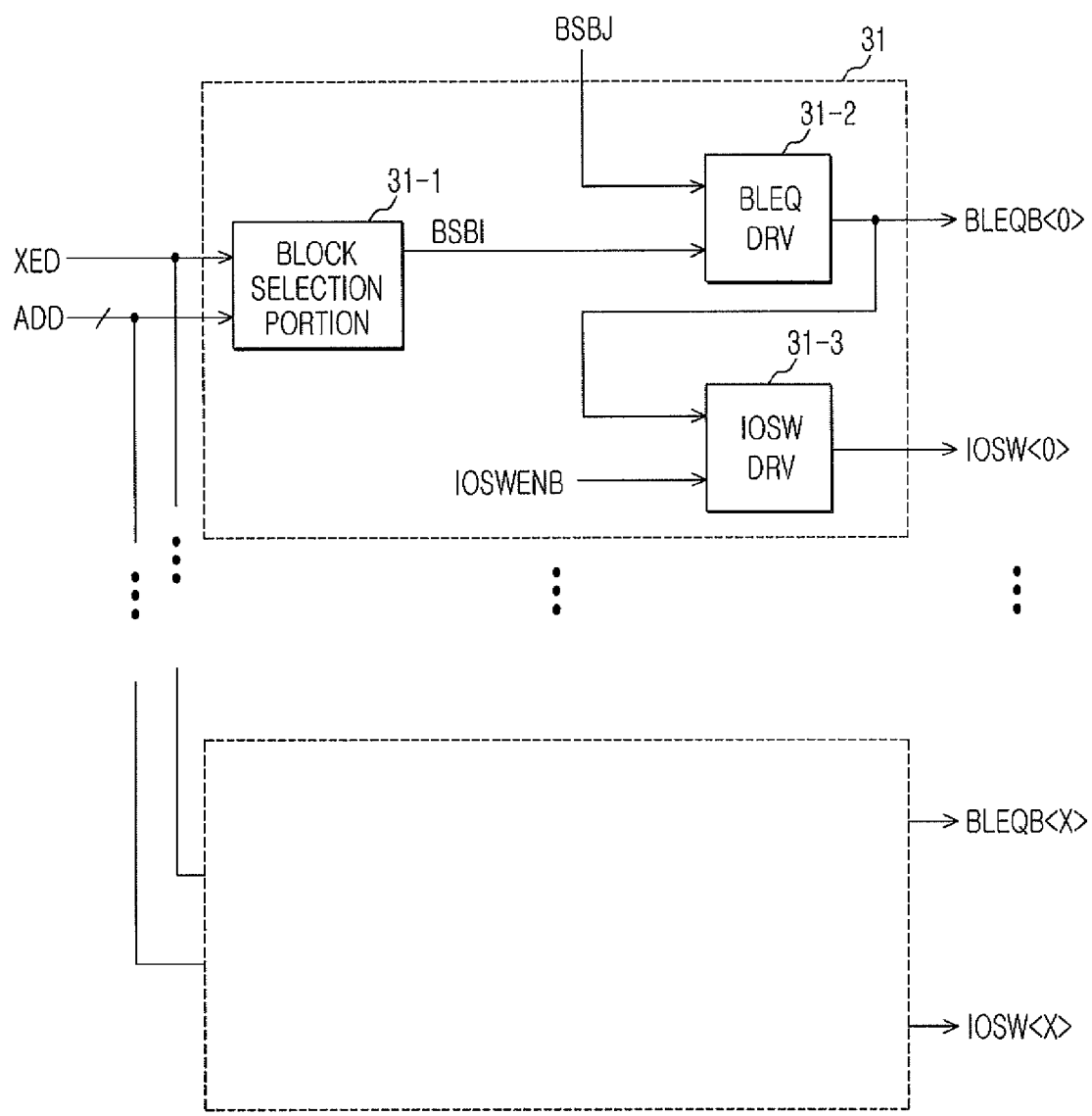
FIG. 2 is a block diagram showing a row path activating unit that can be included with the apparatus of FIG. 1 according to one embodiment.

FIG. 2 is a block diagram showing a row path activating unit 30 that can be included with the apparatus of FIG. 1 according to one embodiment.

The row path activating unit 30 can include a plurality of circuit blocks 31 corresponding to the plurality of cell blocks (CELL BLOCK 0 to CELL BLOCK X) in the cell array circuit unit 40 as shown in FIG. 2.

The circuit block 31 can include a block selection portion 31-1, a BLEQ driver (BLEQ DRV) 31-2, and an IOSW driver (IOSW DRV) 31-3.

The block selection portion 31-1 can generate a block selection signal 'BSBI' for selecting the corresponding block, i.e., CELL BLOCK 0, when the word line enable signal 'XED' is activated and the decoding address 'ADD' is an address that designates a cell block (i.e., CELL BLOCK 0) corresponding thereto.

The BELQ driver (BLEQ DRV) 31-2 can generate a bit line equalize bar signal 'BLEQB<0>' by mixing a block selection signal 'BSBJ' for selecting another cell block adjacent to the CELL BLOCK 0 and the block selection signal 'BSBI'.

The IOSW driver (IOSW DRV) 31-3 can generate an IO switching signal 'IOSW<0>' by mixing the input/output line switch enable bar signal 'IOSWENB' with the bit line equalize bar signal 'BLEQB<0>'.

The IO switching signals 'IOSW<0:X>' are used to control a switch for connecting or disconnecting different input/output lines SIO (not shown) and LIO (not shown) in the cell array circuit unit 40. The input/output line SIO (hereinafter, referred to as 'short IO line') is connected between a bit line sense amplifier and the switch. Another input/output line LIO (hereinafter, referred to as 'local IO line') is connected between another input/output line GIO (not shown) (hereinafter, referred to as 'global IO line') that extends to a pad for data input/output and the switch.

The bit line equalize bar signals 'BLEQB<0:X>' are inverted in the cell array circuit unit 40 and converted to bit line equalize signals 'BLEQ<0:X>', which are used to connect a pair of bit lines. That is, a bit line BL and a bit bar line BLB transmitting a signal having an opposite logical value to the bit line are connected to each other and are precharged.

At this time, the IO switching signals 'IOSW<0:X>' are generated using a voltage greater than an external voltage VDD, i.e., a pumping voltage VPP, to facilitate signal transmission between the short IO line SIO and the local IO line LIO. The bit line equalize bar signals 'BLEQB<0:X>' are generated using a voltage lower than the pumping voltage VPP.

The short IO line SIO and the local IO line LIO are connected to each other by the IO switching signals 'IOSW<0:X>' and the bit line BL and the bit bar line BLB are disconnected from each other by the bit line equalize signals 'BLEQ<0:X>' when the semiconductor memory apparatus performs an active operation.

Meanwhile, the short IO line SIO and the local IO line LIO are disconnected from each other by the IO switching signals 'IOSW<0:X>' and the bit line BL and the bit bar line BLB are connected to each other by the bit line equalize signals 'BLEQ<0:X>' when the semiconductor memory apparatus performs a precharge operation.

Figure 3:
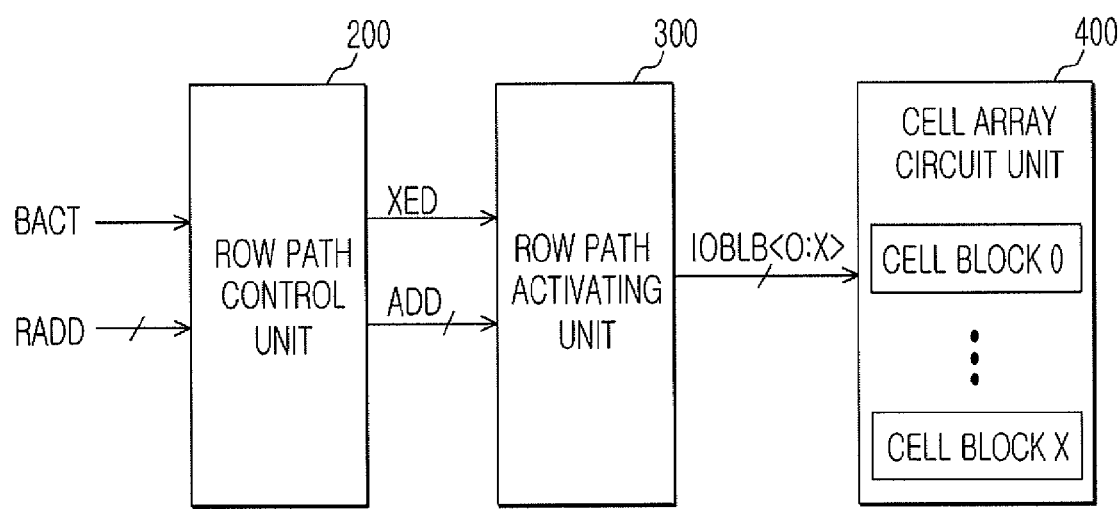
FIG. 3 is a block diagram showing an exemplary semiconductor memory apparatus according to one embodiment of the present invention.

FIG. 3 is a block diagram showing an exemplary semiconductor memory apparatus according to one embodiment of the present invention.

As shown in FIG. 3, the semiconductor memory apparatus 100 can include a row path control unit 200, a row path activating unit 300, and a cell array circuit unit 400.

The row path control unit 200 can generate a word line enable signal 'XED' and a decoding address 'ADD' according to a received bank active command 'BACT' and a received row address 'RADD'. When the bank active command 'BACT' is inputted to the row path control unit 300, the row path control unit 200 can generate the word line enable signal 'XED' delayed by a predetermined timing margin in comparison with the bank active command 'BACT'. The row path control unit 200 can output the decoding address 'ADD' by decoding the row address 'RADD'.

The row path activating unit 300 can generate IO/bit bar line connection control signals 'IOBLB<0:X>' using the word line enable signal 'XED' and the decoding address 'ADD'.

The cell array circuit unit 400 can include a plurality of cell blocks (CELL BLOCK 0 to CELL BLOCK X) that receive the IO/ bit bar line connection control signals 'IOBLB<0:X>'.

Figure 4:
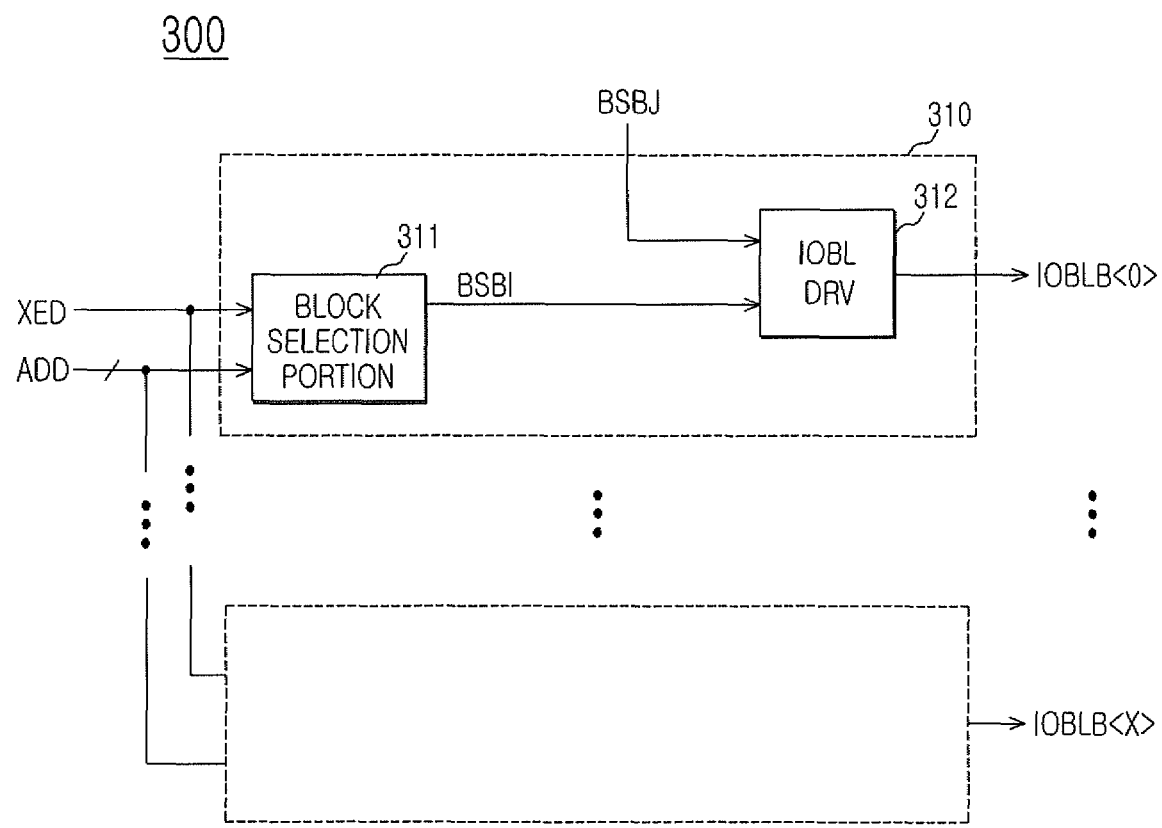
FIG. 4 is a block diagram showing a row path activating unit that can be included with the apparatus of FIG. 3 according to one embodiment of the present invention.

FIG. 4 is a block diagram showing a row path activating unit that can be included with the apparatus of FIG. 3 according to one embodiment of the present invention.

As shown in FIG. 4, the row path activating unit 300 can include a plurality of signal generating circuit blocks 310 corresponding to the plurality of cell blocks (CELL BLOCK 0 to CELL BLOCK X).

The signal generating circuit blocks 310 can include a block selection portion 311 and an IOBL driver (IOSW DRV) 312.

The block selection portion 311 can generate a block selection signal 'BSBI' for selecting a corresponding cell block, i.e., CELL BLOCK 0, when the word line enable signal 'XED' is activated and the decoding address 'ADD' is an address that designates a cell block (i.e., CELL BLOCK 0) corresponding thereto.

The IOBL driver (IOBL DRV) 312 can generate the IO/bit bar line connection control signals 'IOBLB<0:X>' by mixing a block selection signal 'BSBJ' for selecting another cell block adjacent to the CELL BLOCK 0 and the block selection signal 'BSBI'. The two block selection signals 'BSBI' and 'BSBJ' have an activation level, i.e., a low level, when the corresponding cell block is selected.

The IO/bit bar line connection control signals 'IOBLB<0:X>' are inverted in the cell array circuit unit 400 and converted to the bit line equalize signals 'BLEQ<0:X>' to connect a pair of bit lines, i.e., a bit line BL and a bit bar line BLB, to each other and precharge them.

Figure 5:
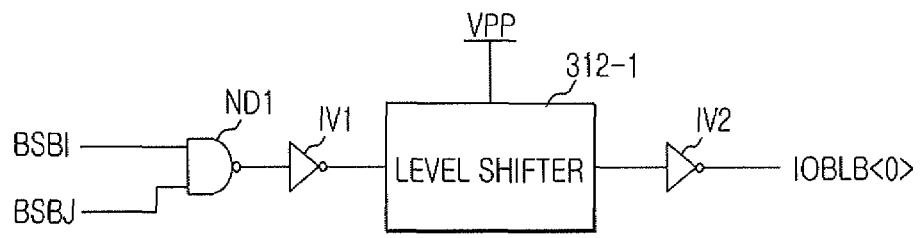
FIG. 5 is a circuit diagram showing an exemplary IOBL driver that can be included with the row path activating unit of FIG. 4 according to one embodiment of the present invention.

FIG. 5 is a circuit diagram showing an exemplary IOBL driver that can be included with the row path activating unit of FIG. 4 according to one embodiment of the present invention.

As shown in FIG. 5, the IOBL driver 312 can include a NAND gate ND1, first and second inverters IV1 and IV2, and a level shifter 312-1.

The IOBL driver 312 can output the IO/bit bar line connection control signal 'IOBLB<0>' at a high level when any one of the two block selection signals 'BSBI' and 'BSBJ' is at a low level. The IOBL driver 312 may also output the IO/bit bar line connection control signal 'IOBLB<0>' at a low level when the two block selection signals 'BSBI' and 'BSBJ' are at a high level. In this case, the IO/bit bar line connection control signal 'IOBLB<0>' is level-shifted to the level of a pumping voltage VPP by the level shifter 312-1.

Figure 6:
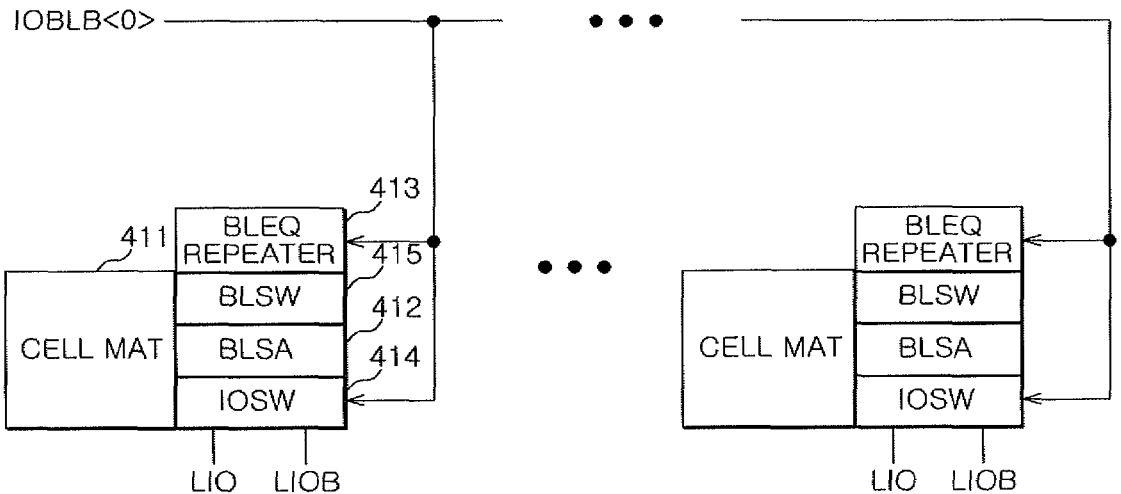
FIG. 6 is a block diagram showing a CELL BLOCK 0 that can be included with the apparatus of FIG. 3 according to one embodiment of the present invention.

FIG. 6 is a block diagram showing a CELL BLOCK 0 that can be included with the apparatus of FIG. 3 according to one embodiment of the present invention.

As shown in FIG. 6, the CELL BLOCK 0 includes a plurality of cell mats 411 and each of the cell mats 411 includes a bit line sense amplifier (BLSA) 412, a BLEQ repeater 413, an input/output line switch (IOSW) 414, and a bit line switch (BLSW) 415.

The bit line sense amplifier (BLSA) 412 is configured to detect and amplify input/output data of the cell mats 411.

Figure 7:
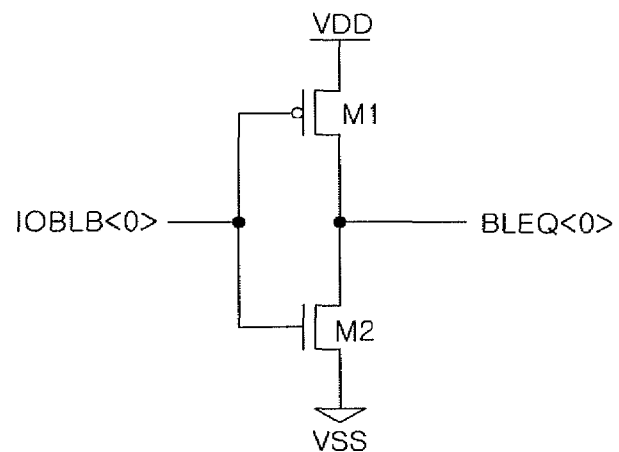
FIG. 7 is a circuit diagram showing an exemplary BLEQ repeater that can be included with the cell block of FIG. 6 according to one embodiment of the present invention.

FIG. 7 is a circuit diagram showing an exemplary BLEQ repeater 413 that can be included in the cell block shown in FIG. 6 according to one embodiment of the present invention.

The BLEQ repeater 413 is configured to invert and transfer the 10/bit bar line connection control signal 'IOBLB<0>' to the bit line switch (BLSW) 415.

As shown in FIG. 7, the BLEQ repeater 413 has an inverter structure comprised of two transistors M1 and M2 and may include a plurality of inverter structures according to a circuit design. The IO/bit bar line connection control signal 'IOBLB<0>' is inverted by the inverter and outputted as the bit line equalize signal 'BLEQ<0>'.

Figure 8:
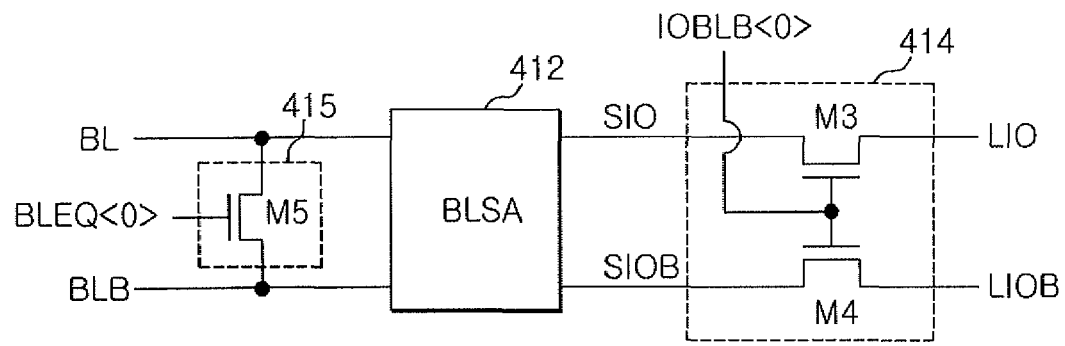
FIG. 8 is a circuit diagram showing an input/output line switch IOSW and a bit line switch BLSW that can be included with the cell block of FIG. 6 according to one embodiment of the present invention.

FIG. 8 is a circuit diagram showing an input/output line switch IOSW 414 and a bit line switch BLSW 415 that can be included in the cell block shown in FIG. 6 according to one embodiment of the present invention.

As shown in FIG. 8, the input/output line switch (IOSW) 414 is connected between different input/output lines SIO (hereinafter, referred to as 'short IO line') and LIO (hereinafter, referred to as 'local IO line') and between different input/output lines SIOB (hereinafter, referred to as 'short IO bar line') and LIOB (hereinafter, referred to as 'local IO bar line'). The short IO bar line SIOB and the local IO bar line LIOB transmit a signal having an opposite logical value to the different input/output lines SIO and LIO.

The bit line switch (BLSW) 415 is connected between a bit line BL and a bit bar line BLB. The bit bar line BLB transmits a signal having an opposite logical value to the bit line BL.

The short IO line pair SIO and SIOB are connected between the bit line sense amplifier (BLSA) 412 and the input/output line switch (IOSW) 414. The local IO line pair LIO and LIOB are connected between the input/output line switch (IOSW) 414 and another input/output line GIO (hereinafter, referred to as 'global IO line') (not shown) that extends to a pad for data input/output.

The input/output line switch (IOSW) 414 can be configured to include a transistor M3 that is connected between the short IO line SIO and the local IO line LIO and a transistor M4 that is connected between the short IO bar line SIOB and the local IO bar line LIOB. The IO/bit bar line connection control signal 'IOBLB<0>' is inputted at a common node of the gates of the two transistors M3 and M4.

The bit line switch (BLSW) 415 can be configured to include a transistor M5 that is connected between the bit line BL and the bit bar line BLB. The bit line equalize signal 'BLEQ<0>' is inputted to a gate of the transistor M5.

The bit line equalize signal 'BLEQ<O>' is the inverse of the IO/bit bar line connection control signal 'IOBLB<0>'.

Accordingly, the IO/bit bar line connection control signal 'IOBLB<0>' is used to control the input/output line switch (IOSW) 414 for data transmission and used for a bit line switch connecting the bit line BL and the bit bar line BLB while precharging them at the same time.

Figure 9:
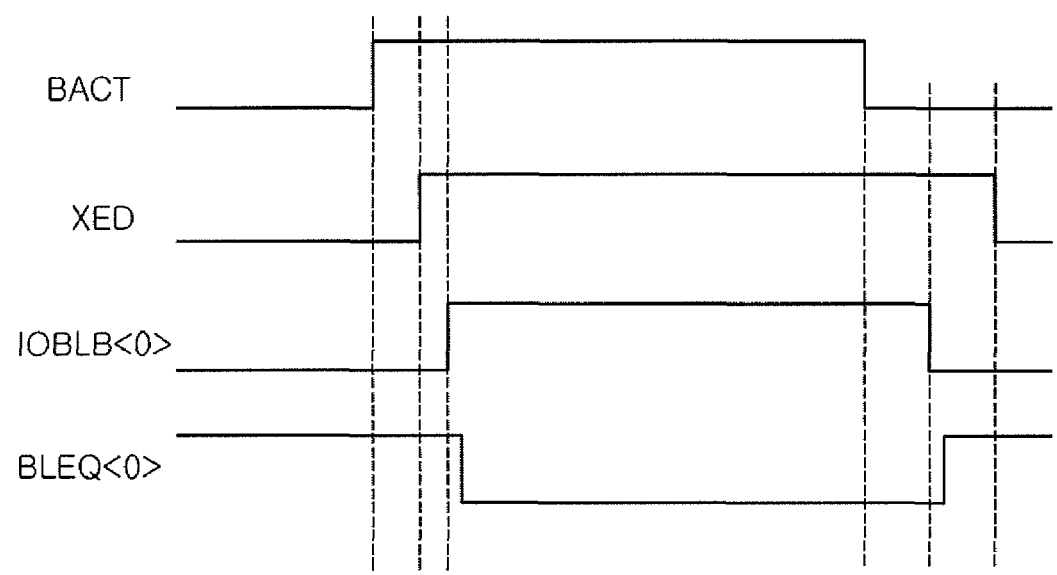
FIG. 9 is a signal waveform diagram showing an exemplary semiconductor memory apparatus according to one embodiment of the present invention.

FIG. 9 is a signal waveform diagram showing an exemplary semiconductor memory apparatus according to one embodiment of the present invention.

Hereinafter, an operation of the semiconductor memory apparatus will be described with reference to FIGS. 3 to 9.

First, when the semiconductor memory apparatus is not in an active state for a read or write operation, i.e., when the bank active command 'BACT' is not activated, the row path control unit 200 deactivates the word line enable signal 'XED'.

The block selection signals 'BSBI' 'BSBJ', etc. are deactivated and set to a predetermined level, i.e., a high level, since the word line enable signal 'XED' is in a deactivation state.

The row path activating unit 300 can output the IO/bit bar line connection control signals 'IOBLB<0:X>' at a low level as shown in FIG. 5 since the block selection signals 'BSBI', 'BSBJ', etc. are at a high level.

The bit line equalize signals 'BLEQ<0:X>' are outputted at a high level as shown in FIG. 7 since the IO/bit bar line connection control signals 'IOBLB<0:X>' are at a low level.

As the bit line equalize signals 'BLEQ<0:X>' are at a high level, the bit line switch (BLSW) 415 is turned on to connect the bit line BL and the bit bar line BLB to each other, such that the bit line BL and the bit bar line BLB are precharged with the same potential.

Further, the input/output line switch 414 is turned off to disconnect the short IO line SIO and the local IO line LIO from each other and the short IO bar line SIOB and the local IO bar line LIOB from each other as shown in FIG. 8 since the IO/bit bar line connection control signals 'IOBLB<0:X>' are at a low level.

On the contrary, when the bank active command 'BACT' is active and inputted, the row path control unit 200 can generate the word line enable signal 'XED' that is delayed by a predetermined timing margin in comparison with the bank active command 'BACT' and output the decoding address 'ADD' by decoding the row address 'RADD'.

The row path activating unit 300 can activate the block selection signal 'BSBI' at a low level for selecting the CELL BLOCK 0 when the word line enable signal 'XED' is activated and the decoding address 'ADD' is an address that designates a cell block (i.e., CELL BLOCK 0) corresponding thereto.

As the block selection signal 'BSBI' is activated, the IO/bit bar line connection control signal 'IOBLB<O>' is outputted at a high level.

The bit line equalize signal 'BLEQ<0>' is outputted having a low level as shown in FIG. 7 since the IO/bit bar line connection control signal 'IOBLB<O>' is at a high level.

As the bit line equalize signal 'BLEQ<0>' is at a low level, the bit line switch (BLSW) 415 is turned off to disconnect the bit line BL and the bit bar line BLB from each other, such that the bit line sense amplifier (BLSA) 412 can detect and amplify data.

Further, since the IO/bit bar line connection control signal 'IOBLB<0>' is at a high level, the input/output line switch 414 is turned on to connect the short IO line SIO and the local IO line LIO to each other and the short IO bar line SIOB and the local IO bar line LIOB to each other as shown in FIG. 8.

The data that is detected and amplified by the bit line sense amplifier (BLSA) 412 is then transferred to peripheral circuits via the local 10 line LIO and the local IO bar line LIOB.

When the semiconductor memory apparatus performs the active operation, the input/output line switch 414 is turned on and the bit line switch (BLSW) 415 is turned off. Conversely, when the semiconductor memory apparatus performs the precharge operation, the input/output line switch 414 is turned off and the bit line switch (BLSW) 415 is turned on.

The embodiment according to the present invention as described above is configured to control an input/output line switch and a bit line switch using a common signal, that is, IO/bit bar line connection control signals 'IOBLB<0:X>' through the above-mentioned operating principle.

Accordingly, in the semiconductor memory apparatus according to an embodiment of the present invention, it is possible to reduce current consumption since the semiconductor memory apparatus can control the connection/disconnection of signal lines for a precharge operation and an active operation using only the IO/bit bar line connection control signals 'IOBLB<0:X>'.

Further, according to the embodiment of the present invention, it is possible to simplify the layout of the signal lines and secure a large layout margin since only a signal line for transmitting the IO/bit bar line connection control signals 'IOBLB<0:X>' is needed between a row path activating unit 300 and a cell array circuit unit 400.

While certain embodiments have been described above, it will be understood to those skilled in the art that the embodiments described are by way of example only. Accordingly, the apparatus described herein should not be limited based on the described embodiments. Rather, the apparatus described herein should only be limited in light of the claims that follow when taken in conjunction with the above description and accompanying drawings.

What is claimed is:

1. A semiconductor memory apparatus, comprising:
   a row path activating unit configured to generate a line connection control signal according to an address and an active command;
   a cell array circuit unit including an input/output line switch for connecting a first input/output line in a cell block to a second input/output line extending outside the cell block and a bit line switch for connecting bit lines of a bit line pair to each other, and the cell array circuit unit is configured to control the input/output line switch and the bit line switch using the line connection control signal; and
   a row path control unit configured to provide a word line enable signal to the row path activating unit that is generated by delaying the active command by a predetermined time and to provide the address to the row path activating unit that is generated by decoding an external address.

2. The semiconductor memory apparatus of claim 1, wherein the row path activating unit includes:
   a block selection portion configured to generate a block selection signal for selecting the cell block according to the word line enable signal and the address; and
   a driver configured to generate the line connection control signal using the block selection signal and a second block selection signal used for selecting another cell block.

3. The semiconductor memory apparatus of claim 2, wherein the driver is configured to generate the line connection control signal by level-shifting a result of logically combining the block selection signal and the second block selection signal used for selecting another cell block.

4. The semiconductor memory apparatus according to claim 1, wherein the cell array circuit unit is configured to control the bit line switch using an internal signal that is generated by inverting the line connection control signal.

5. A semiconductor memory apparatus, comprising:
   a row path activating unit configured to activate a line connection control signal when an active command and an address corresponding to the row path activating unit are inputted;
   a cell array circuit unit including a cell block, an input/output line switch, and a bit line switch; and
   a row path control unit configured to provide a word line enable signal to the row path activating unit that is generated by delaying the active command by a predetermined time and to provide the address to the row path activating unit that is generated by decoding an external address,
   wherein the cell array circuit unit connects a first input/output line in the cell array circuit unit to a second input/output line extending outside the cell array circuit unit by controlling the input/output line switch according to an activated line connection control signal, and disconnects bits lines of a bit line pair by controlling the bit line switch.

6. The semiconductor memory apparatus of claim 5, wherein the row path activating unit includes:
   a block selection portion configured to generate a block selection signal for selecting the cell block according to the word line enable signal and the address; and
   a driver configured to generate the line connection control signal using the block selection signal and a second block selection signal used for selecting another cell block.

7. The semiconductor memory apparatus of claim 6, wherein the driver is configured to generate the line connection control signal by level-shifting a result of logically combining the block selection signal and the second block selection signal used for selecting another cell block.

8. The semiconductor memory apparatus of claim 5, wherein the cell array circuit unit is configured to disconnect the first input/output line in the cell array circuit unit from the second input/output line extending outside the cell array circuit unit by controlling the input/output line switch according to a deactivated line connection control signal and connecting bit lines of the bit line pair by controlling the bit line switch.

9. A semiconductor memory apparatus, comprising:
   a signal generation circuit block configured to generate a line connection control signal according to an active command and an address;
   a cell block including a memory cell and a bit line sense amplifier connected to the memory cell through a bit line pair;
   an input/output line switch configured to connect or disconnect a first input/output line connected to the bit line sense amplifier to/ from a second input/output line extending outside the cell block according to the line connection control signal; and
   a bit line switch configured to disconnect or connect bit lines of the bit line pair according to the line connection control signal,
   wherein the signal generation circuit block includes:
   a block selection portion configured to generate a block selection signal for selecting the cell block when the active command is inputted and the address corresponds to the signal generation circuit block; and
   a driver configured to generate the line connection control signal using the block selection signal and a second block selection signal used for selecting another cell block.

10. The semiconductor memory apparatus of claim 9, wherein the driver is configured to generate the line connection control signal by level-shifting a result of logically combining the block selection signal and the second block selection signal used for selecting another cell block.

11. The semiconductor memory apparatus of claim 9, wherein the cell block further includes a repeater configured to invert the line connection control signal and transfer the inverted line correction control signal to the bit line switch.

12. The semiconductor memory apparatus of claim 9, wherein when the active command is inputted and the address corresponds to the signal generation circuit block, the input/output line switch connects the first input/output line connected to the bit line sense amplifier to the second input/output line extending outside the cell block according to the line connection control signal and the bit line switch disconnects bit lines of the bit line pair according to the line connection control signal.

13. The semiconductor memory apparatus of claim 9, wherein when the active command is not inputted and the address does not correspond to the signal generation circuit block, the input/output line switch disconnects the first input/output line connected to the bit line sense amplifier from the second input/output line extending outside the cell block according to the line connection control signal and the bit line switch connects bit lines of the bit line pair according to the line connection control signal.

* * * * *